(12) United States Patent
Senouci (10) Patent No.: US 7,912,516 B2
(45) Date of Patent: Mar. 22, 2011

(54) OPERATION CONTROLLING

(75) Inventor: Noureddine Senouci, St-Blaise/Neuchâtel (CH)

(73) Assignee: On Semiconductor Trading Ltd., Hamilton (BM)

( * ) Notice: Subject to any disclaimer, the term of this patent is extended or adjusted under 35 U.S.C. 154(b) by 458 days.

(21) Appl. No.: 11/413,175

(22) Filed: Apr. 28, 2006

(65) Prior Publication Data

US 2007/0008752 A1    Jan. 11, 2007

(30) Foreign Application Priority Data

Apr. 29, 2005   (EP) .................................. 05405326

(51) Int. Cl.
*H02M 1/00* (2007.01)
(52) U.S. Cl. ........................................ 455/574; 455/573
(58) Field of Classification Search .................. 320/162, 320/132, 148, 155, 151, 152, 161; 455/127.1, 455/127.5, 161.1, 343.1, 571, 572, 573, 574
See application file for complete search history.

(56) References Cited

U.S. PATENT DOCUMENTS

| 6,310,556 | B1 * | 10/2001 | Green et al. | 340/636.15 |
|---|---|---|---|---|
| 2002/0158612 | A1 * | 10/2002 | Genest et al. | 323/274 |
| 2003/0104849 | A1 * | 6/2003 | Arimitsu | 455/574 |
| 2003/0122524 | A1 * | 7/2003 | Rhee et al. | 320/128 |
| 2005/0196002 | A1 * | 9/2005 | Hagen et al. | 381/314 |

OTHER PUBLICATIONS

Texas Instruments, TPS3801/09—Smallest SVS for Monitoring DSPs and Processors, Application Report, Sep. 1999, 1-23.
Texas Instruments, TPS3820-xx, TPS3823-xx, TPS3824-xx, TPS3825-xx, TPS-3828xx Processor Supervisory Circuits, Dec. 2002, 1-14.
ADM696/ADM697, Microprocessor Supervisory Circuits, Analog Devices, 1-11.

* cited by examiner

*Primary Examiner* — Bao Q Vu
*Assistant Examiner* — Nguyen Tran
(74) *Attorney, Agent, or Firm* — Birch, Stewart, Kolasch and Birch, LLP (57) ABSTRACT

The invention deals with a controlling device (22) for an electrical device such as for example a hearing aid (20). The hearing aid (20) includes a power supply (23) and a functional unit (21) controlled by the controlling device (22) via a reset signal (2). In order to reduce undesired behavior of the hearing aid in case of transients, brown-out or other oscillations of the input voltage (1), the controlling device (22) is built such that the functional unit (21) is resetted as long as the rising supply voltage (1) is lower than a startup threshold. Once the functional unit (21) is enabled, it remains enabled as long as the supply voltage (1) does not fall below a shutdown threshold where the shutdown threshold voltage is lower than the startup threshold voltage. This hysteresis is implemented via a reference generator (24) generating a constant reference voltage (27) and a modifiable voltage divider (28) which generates different output voltages (1.1) in dependency of the output of the comparator (25).

16 Claims, 4 Drawing Sheets

OPERATION CONTROLLING

TECHNICAL FIELD

The invention relates to a method for controlling an operation of an electrical device, particularly a listening device, where a supply voltage is provided by a voltage source, particularly a battery. The invention further relates to a controlling device for controlling an operation of an electrical device, particularly a listening device, which includes a voltage source, particularly a battery, for providing a supply voltage. The invention further relates to an electrical device, particularly a listening device, which includes a voltage source, particularly a battery, for providing a supply voltage and a controlling device.

BACKGROUND ART

Over the last decades, thousands and thousands of different devices that need electrical power for their operation have been developed and produced. Many of them have been designed for mobile use, that is they have been equipped with a storage for storing electrical power such that the device is operable independent of a power supply network for at least a specified period of time. Batteries or accumulators, whether rechargeable or not, may be used for this purpose.

One of the problems that may arise with such devices is that the electrical power delivered to the device may show irregularities, for example during the startup and the shutdown process. Several non-ideal conditions may be observed when the device is switched on or off or when a battery is inserted or removed. Such conditions may for example include transients, brown-out or other oscillations of the input voltage. These conditions may have a minor impact on simple devices such as for example a mobile device for playing back music or a torch light. However, with more complex devices such as for example devices including a digital circuit like contemporary listening devices these conditions may have a negative effect on the operation of its digital circuit. They may for example cause undesired operations such as arithmetic operations of a digital processor or read/write operations of a memory block, for example an EEPROM (Electrically Erasable Programmable Read Only Memory). Such conditions may even damage the device.

To avoid these non-ideal conditions chatter-free switches may be used. However, such switches do not eliminate the above problems when the battery is inserted or removed while the ON/OFF switch remains open or closed or when there is no ON/OFF switch at all.

SUMMARY OF THE INVENTION

It is the object of the invention to create a method pertaining to the technical field initially mentioned, that avoids the problems mentioned above and enables a safe startup and shutdown process of an electrical device.

The solution of the invention is specified by the features of claim 1. In a method for controlling an operation of an electrical device, particularly a listening device such as for example a hearing aid, a headset or the like, a supply voltage is provided by a voltage source, particularly a battery. According to the invention a transition of at least a part of the electrical device from a disabled state to an enabled state is initiated after the supply voltage has risen above a startup reference voltage and where a transition from the enabled state to the disabled state is initiated when the supply voltage falls below a shutdown reference voltage where the shutdown reference voltage is lower than the startup reference voltage.

Therefore, the threshold voltage for initiating the transition from one state to the other state of the electrical device is higher for a rising supply voltage than for a falling supply voltage. Hence, once the supply voltage has risen above the startup reference voltage, the supply voltage may vary without any undesired toggling of the electrical device between the enabled and the disabled states as long as it remains above the shutdown reference voltage. So the likelihood of undesired operations or even damage of the electrical device can be reduced significantly.

In a preferred embodiment of the method according to the invention, the transition from the disabled state to the enabled state is initiated after the supply voltage has risen above the startup reference voltage and has remained above the shutdown reference voltage during a given delay. In other words, the transition from the disabled state to the enabled state is not initiated instantly when the supply voltage rises above the startup reference voltage. After the supply voltage rises above the startup reference voltage, the system waits for a given period of time before the transition from the disabled to the enabled state is initiated. In case the supply voltage falls below the shutdown reference voltage during the given delay, the system does not go fully active, the delay is reset and the device remains in the disabled state. The delay starts again when the supply voltage rises above the startup reference voltage the next time.

In this way, the system is allowed to stabilise during the delay before it goes fully active. Since most of the oscillations of the supply voltage occur during the initial transient phase of the electric device (and of course during the shutdown process), the delay is preferably chosen such that this startup phase is terminated before the delay has expired.

In order to initiate the transition from the disabled to the enabled state it has to be determined whether the supply voltage has risen above the startup reference voltage or not. It would be possible to directly compare the supply voltage with the startup reference voltage. To provide the startup reference voltage, a separate voltage source could be used. Another option would be to generate the startup reference voltage from the supply voltage itself, for example by means of a voltage divider or another, specific device.

In a preferred embodiment of the invention, it is not the supply voltage that is compared with the startup reference voltage. In order to determine whether the supply voltage has risen above the startup reference voltage, a startup comparison voltage that is proportional to the supply voltage and a reference voltage are preferably generated. Then the startup comparison voltage is compared with the reference voltage. The reference voltage is for example generated or derived from the supply voltage. The startup comparison voltage and the reference voltage are generated such that the startup comparison voltage rises above the reference voltage at the same time when the supply voltage rises above the startup reference voltage.

To initiate the transition from the enabled to the disabled state it is determined when the supply voltage falls below the shutdown reference voltage. In this case it would too be possible to directly compare the falling supply voltage with the shutdown reference voltage provided by a separate voltage source or derived from the supply voltage.

However, in the case where a reference voltage is generated, this reference voltage is also used to determine when the supply voltage falls below the shutdown reference voltage. this is done by generating a shutdown comparison voltage proportional to the supply voltage too and comparing the shutdown comparison voltage with the reference voltage.

In other words: Instead of comparing the supply voltage with the startup reference voltage and the shutdown reference voltage, a single reference voltage is compared with a startup comparison voltage and a shutdown comparison voltage where both the startup and the shutdown comparison voltages are proportional to the supply voltage. Since the startup reference voltage is higher than the shutdown reference voltage, the startup comparison voltage is lower than the shutdown comparison voltage.

Preferably, the shutdown comparison voltage and the startup comparison voltage are generated by means of a single, variable, ohmic voltage divider.

Concerning a controlling device pertaining to the technical field initially mentioned the solution of the invention is specified by the features of claim 6. A controlling device according to the invention for controlling an operation of an electrical device, particularly a listening device, where the electrical device includes a voltage source for providing a supply voltage includes means for initiating a transition of the electrical device from a disabled state to an enabled state after the supply voltage rises above a startup reference voltage and means for initiating a transition from the enabled state to the disabled state when the supply voltage falls below a shutdown reference voltage, where the shutdown reference voltage is lower than the startup reference voltage.

Since the problems initially mentioned typically occur with mobile electrical devices, the voltage source is preferably a battery whether rechargeable or not.

The controlling device may either be a separate device or it may be integrated into the electrical device whose operation it shall control.

In a preferred embodiment of the invention, the means for initiating the transition of the electrical device from the disabled state to the enabled state are built such that this transition is initiated after the supply voltage has risen above the startup reference voltage and has remained above the shutdown reference voltage during a given delay.

For determining whether the supply voltage has risen above the startup reference voltage, the controlling device preferably includes a comparator and more particularly a voltage comparator. The comparator typically has two inputs and an output where the output changes either from low to high or from high to low at the moment when one of the inputs rises above or falls below the other input. Therefore, the output of the comparator can be used to generate a reset signal that is either high or low depending on the comparator output where the transition from the disabled to the enabled or from the enabled to the disabled state of the electrical device is initiated by a change of the level of the reset signal, that is by a change of the comparator output.

As outlined above, the determination whether the supply voltage has risen above the startup reference voltage or fallen below the shutdown reference voltage is performed by comparing a reference voltage with a startup and a shutdown comparison voltage. Both of these comparison voltages are proportional to the supply voltage. While the reference voltage can for example be generated by a separate voltage source, it is preferably generated by a reference voltage generator that is supplied with electrical energy from the voltage source of the electrical device.

For generating the comparison voltages, the controlling device preferably includes a voltage divider that is built such that a startup comparison voltage or a shutdown comparison voltage is generatable respectively in dependency of an output of the comparator where the reference voltage is connected to a first input of the comparator and the comparison voltage is connected to a second input of the comparator. If for example the startup comparison voltage that is generated by the voltage divider is rising but still lower than the reference voltage and the output of the comparator is low, the output of the comparator changes to high when the startup comparator voltage has risen and remained above the reference voltage for a given delay. At the same moment, when the comparator output goes high, the voltage divider changes and generates the shutdown comparison voltage. This means that the reference voltage now is compared with the shutdown comparison voltage.

The reference voltage of the controlling device may have a fixed value that is for example preset during manufacturing of the electrical device. In an advantageous embodiment of the controlling device, the reference voltage generator includes selection means for selecting a level of the reference voltage. This gives the user or operator of the electrical device the possibility to adapt the controlling device and therewith the electrical device to different conditions like environmental conditions (including for example temperature and humidity) or other conditions like the condition of the electrical device itself (including for example the current workload of the device).

While the selection means may be realised by switches that are manually activated by the user, the selection means are preferably built for selecting the level of the reference voltage by soft programming. This for example enables a user to program the device according to his current needs or it enables the device to autonomously react to different conditions.

In another preferred embodiment of the invention, the controlling device includes a delay generator with a counter and an oscillator such as for example a clock generator for generating the above mentioned delay. The clock generator produces a clock signal with a predefined clock frequency and the counter, the input of which is connected to the output of the clock generator, starts to count the clock pulses when the comparator output changes to the specified level. The output of the counter serves for example as the reset signal. In the above mentioned example, the counter starts to count the clock pulses when the startup comparison voltage rises above the reference voltage. When the predefined delay has expired, that is when the counter has counted up a predefined number of clock pulses or reached a predefined state, its output and therewith the reset signal changes in order to initiate the transition from the disabled to the enabled state of the electrical device.

If the electrical device includes a digital circuit such as for example a modern hearing aid with a digital signal processor, the digital circuit is typically synchronised and driven by a clock signal with a specified clock frequency. Furthermore, some devices offer different modes of operation such as for example a normal operation mode or a low power mode in which the device consumes significantly less electrical energy. In a device that offers a lower power mode, the controlling device includes preferably a low power mode input. For driving the electrical device when the low power mode is activated, the controlling device is built such that a low power mode clock frequency which is lower than the normal clock frequency of the electrical device is generatable. In a further preferred embodiment, this low power mode clock frequency is produced by the above-mentioned clock generator, where its output is directly used as the low power mode clock or where the frequency of the output of the clock generator can be further reduced for example by means of a frequency divider such as a flip-flop or the like.

Concerning an electrical device, particularly a listening device, pertaining to the technical field initially mentioned the solution of the invention is specified by the features of claim 13. The electrical device according to the invention includes a voltage source for providing a supply voltage and a controlling device as described above where the voltage source is preferably a battery.

Other advantageous embodiments and combinations of features come out from the detailed description below and the totality of the claims.

BRIEF DESCRIPTION OF THE DRAWINGS

The drawings used to explain the embodiments show.

In the figures, the same components are given the same reference symbols.

PREFERRED EMBODIMENTS

Figure 1:
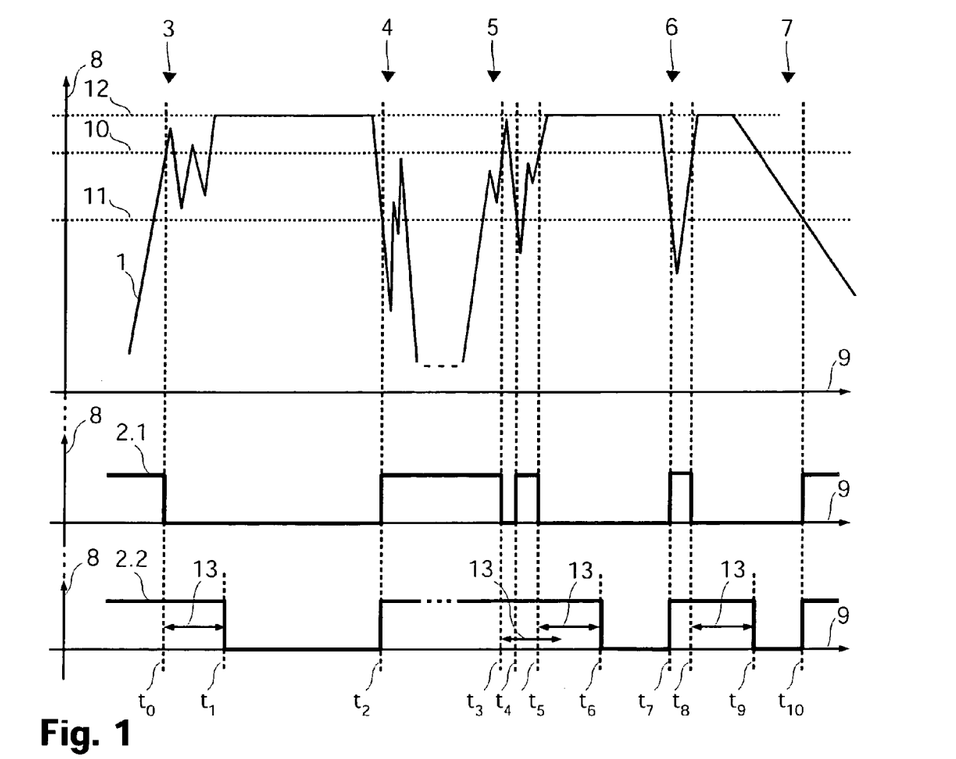
FIG. 1 A schematic illustration of the generation of the reset signal according to the invention.

FIG. 1 schematically shows how a reset signal for controlling the operation of an electrical device, in this case of a hearing aid, is generated. FIG. 1 shows the supply voltage 1 of the hearing aid as voltage amplitude 8 against time 9. It further shows two different reset signals 2.1 and 2.2 generated according to the invention. Different phases are shown: a first startup phase 3, a shutdown phase 4, a second startup phase 5, a transient phase 6 and a dying phase 7.

The first startup phase 2 shows the supply voltage 1 when a battery is inserted into the hearing aid. During the first startup phase 2, the supply voltage 1 rises and oscillates undesirably. At the time $t_0$ when the supply voltage 1 exceeds a startup threshold voltage 10, the first reset signal 2.1 changes its level from high to low. A high level of the reset signal means that the hearing aid is resetted and a low level of the reset signal means that the hearing aid is not resetted. As it is shown in FIG. 1, although the supply voltage 1 oscillates during the startup phase 2, the supply voltage 1 remains above a shutdown threshold 11. Since the supply voltage 1 does not fall below the shutdown threshold 11, the first reset signal 2.1 remains low which means that the hearing aid remains activated. After the startup phase 2, that is when the supply voltage 1 has stabilised and remains more or less at its nominal value 12, the first reset signal remains low.

During the shutdown phase 4, when for example the hearing aid is switched off or when the battery is removed, the supply voltage falls and again oscillates. The controlling device detects when the supply voltage 1 falls below the shutdown threshold 11 which occurs at time $t_2$. At this time $t_2$, the first reset signal 2.1 changes its level from low to high. At the second startup phase 5, the first reset signal 2.1 changes to low at time $t_3$ when the supply voltage 1 again rises above the startup threshold 10. However, the supply voltage 1 is shown to oscillate during the second startup phase 5 such that it falls below the shutdown threshold 11 at time $t_4$ and rises above the startup threshold 10 again at time $t_5$. Accordingly, the first reset signal 2.1 changes to high at time $t_4$ and to low again at time $t_5$.

The transient phase 6 shows a transient of the supply voltage 1. As before, the reset signal 2.1 goes high when the supply voltage 1 falls below the shutdown threshold 11 at time $t_7$ and it goes low when the supply voltage 1 rises above the startup threshold 10 at time $t_8$. The dying phase 7 shows the supply voltage 1 when the battery dies. Again, the reset signal 2.1 goes high when the supply voltage 1 falls below the shutdown threshold 11 at time $t_{10}$.

Compared with a hearing aid, where only one reference voltage is used as the startup reference voltage and the shutdown reference voltage (where the only reference voltage would typically be somewhere between the startup and the shutdown reference voltages), the switching operations of the reset signal is significantly reduced.

In order to further reduce the switching of the reset signal, the second reset signal 2.2 is generated slightly different. Instead of going low exactly at the moment when the supply voltage 1 exceeds the startup threshold 10, the controlling device is built such that the reset signal 2.2 only goes low after the supply voltage 1 has remained above the shutdown threshold for a given delay 13. Therefore, at the first startup phase 3, the second reset signal 2.2 goes low at time $t_1$ which is $t_0$ plus the delay 13. During the second startup phase 5, it can be seen, that the second reset signal 2.2 does not change to low, because the supply voltage 1 falls below the shutdown threshold 11 at time $t_4$, that is before the delay 13 is lapsed after the time $t_3$. Hence, the reset signal 2.2 remains high. It does not go low until time $t_6$ which is $t_5$ where the supply voltage 1 again exceeds the startup threshold 10 plus the delay 13. And after the reset signal 2.2 has gone high at time $t_7$, because the supply voltage 1 falls below the shutdown threshold 11, the reset signals 2.2 goes low again at time $t_9$ which is $t_8$ plus the delay 13.

It is to note that the transition of the second reset signal 2.2 from low to high at times $t_2$ and $t_7$, is the same as with the first reset signal 2.1 but that the second reset signal 2.2 changes its level less frequently than the first reset signal 2.1.

Figure 5:
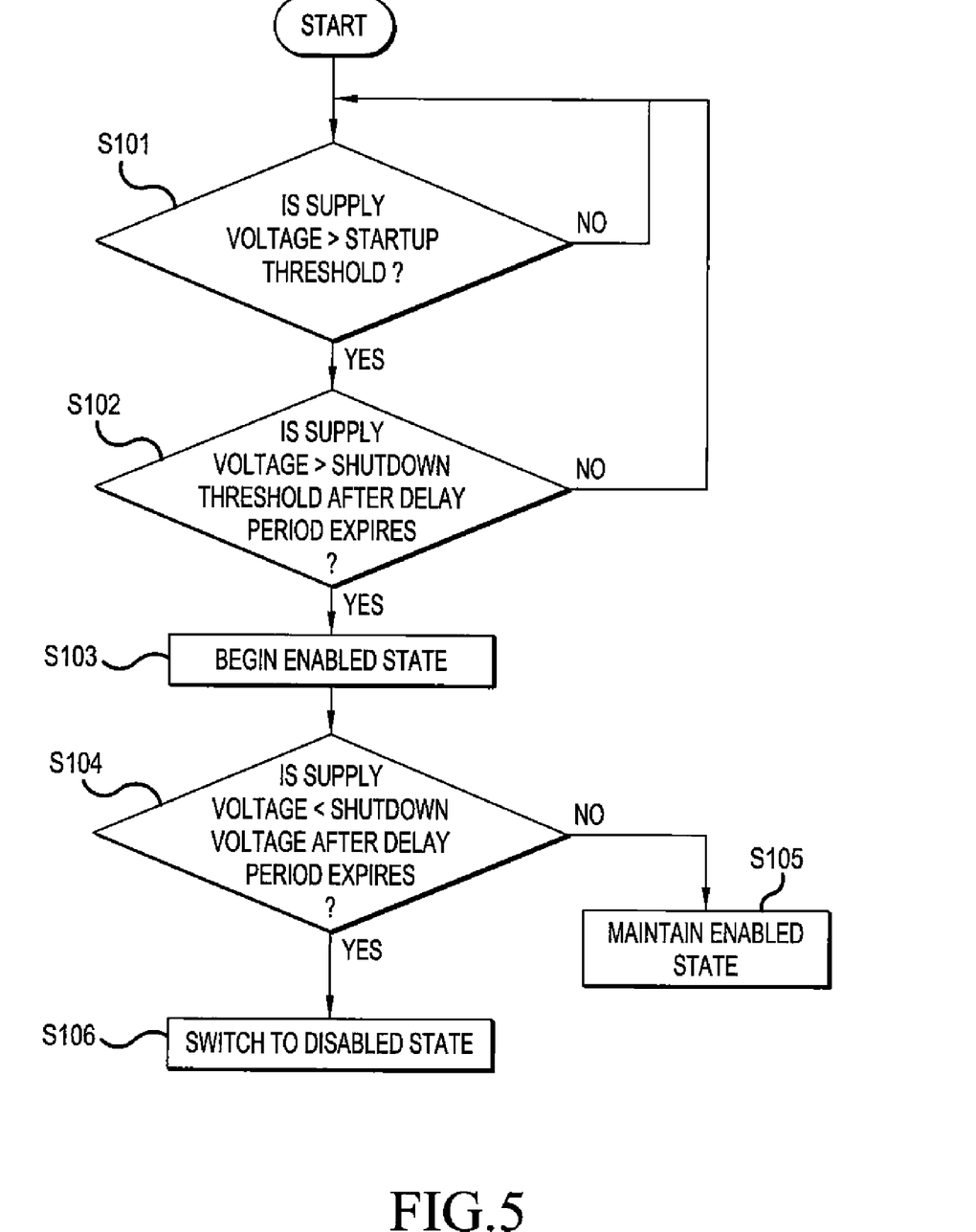
FIG. 5 a method flow diagram.

Because of the fact that a reset signal is generated which controls the operation of the hearing aid such that the hearing aid is enabled only when the supply voltage 1 has risen above the startup threshold and stabilised above the shutdown threshold, undesired behaviour and damage of the hearing aid can be avoided. This is true for the method of generating the first reset signal 2.1 as well and particularly for the method of generating the second reset signal 2.2 that is shown by FIG. 5. In this regard, FIG. 5 shows step S101 in which it is determined whether the level of the supply voltage is greater than the level of the startup threshold voltage. If it is, the step S102 determines if the level of the supply voltage remains greater than the level of the shutdown threshold voltage after the below-noted given delay period 13 expires. If it is, the enabled state is initiated in step S103. The relationship of the supply voltage levels and the shutdown voltage levels are monitored after the below-noted given delay period 13 expires and as long as the supply voltage remains greater than the shutdown voltage threshold, the enabled state is maintained as to step S105. However, if the supply voltage level drops below the shutdown voltage level after the below-noted given delay period 13 expires, the device is transitioned into the disabled state as indicated by step S106.

Figure 2:
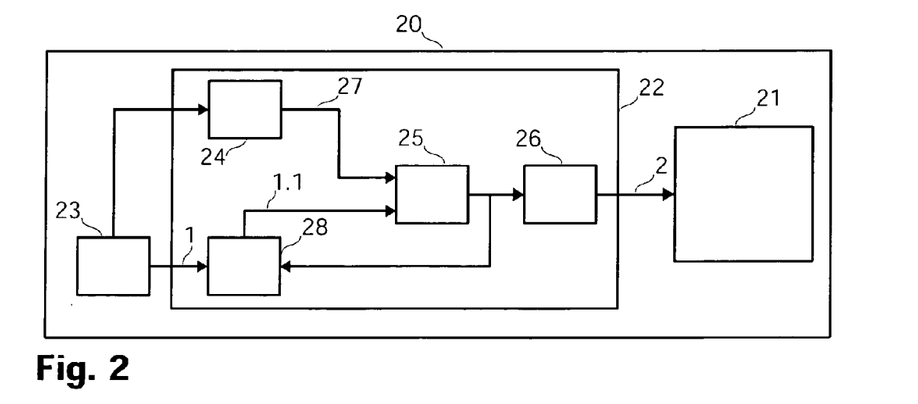
FIG. 2 a schematic block diagram of a hearing aid with a controlling device according to the invention.

FIG. 2 shows a schematic block diagram of a hearing aid 20 with a controlling device 22 according to the invention. The hearing aid 20 also includes a power supply 23 for supplying the hearing aid 20 with electrical energy and a functional unit 21 such as a digital unit implemented for example as a digital circuit on a microchip. The functional unit 21 is controlled by the controlling device 22 by means of a reset signal 2. The hearing aid 20 may also include other parts such as microphones, analog-to-digital converters, digital-to-analog converters, loudspeakers as well as other signal processing means such as for example a DSP (digital signal processor) and other analog or digital processing means. Since these parts of a hearing aid are not relevant in connection with this invention, they are not shown in the figures.

The controlling device 22 includes a reference generator 24 for generating a reference voltage 27, a voltage divider 28 which receives the supply voltage 1 from the power supply 23 and generates a comparison supply voltage 1.1 proportional to the supply voltage 1, a voltage comparator 25 for comparing the reference voltage 27 with the output of the voltage divider 28 and a counter 26 for generating the delay as well as the reset signal 2.

The reference generator 24 is also connected to the power supply 23. As soon as the supply voltage 1 from the power supply 23 rises above a certain voltage level, the reference voltage 27 is generated and compared with the comparison supply voltage 1.1 from the voltage divider 28.

Figure 6:
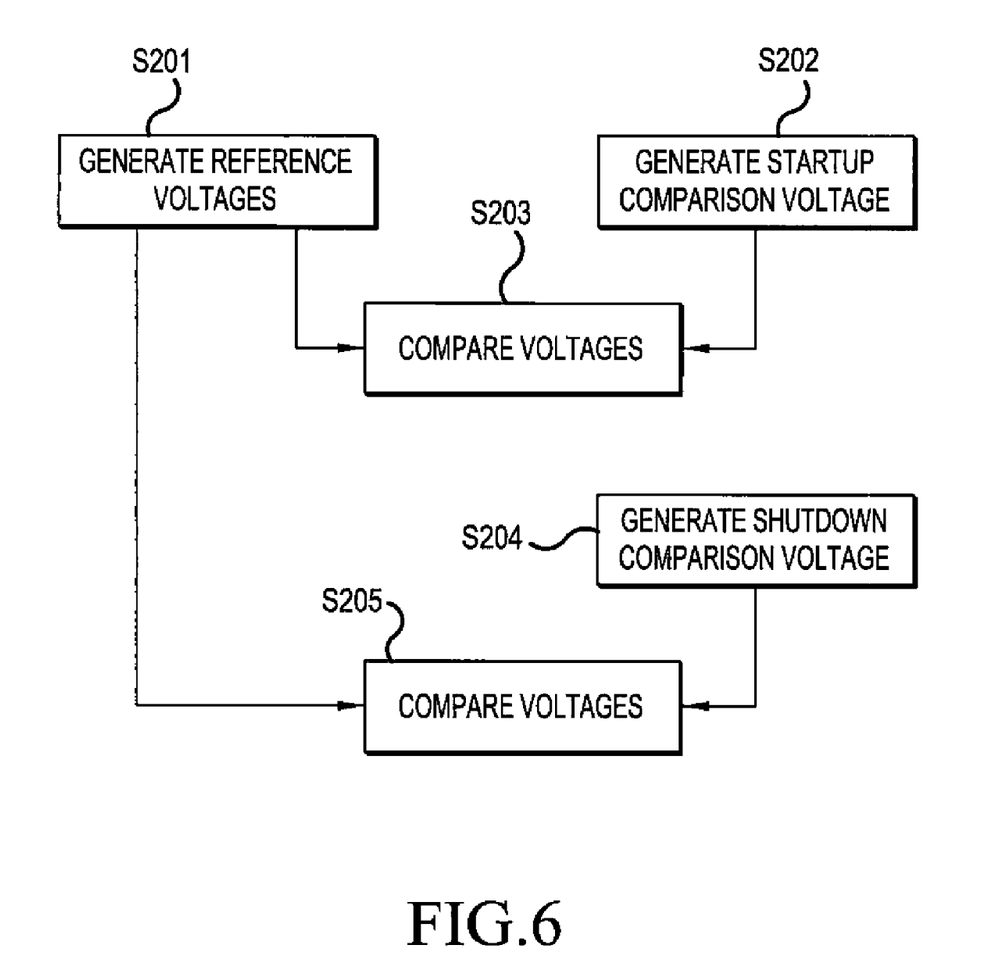
FIG. 6 a sub-method flow diagram.

This operation is shown by FIG. 6 that illustrates generating the reference voltages in step S201 and shows the comparison thereof with the startup comparison voltage of step S202 in step S203. The reference voltage generated in step S201 is also compared (in step S205) to a shutdown comparison voltage in step S205.

The voltage divider 28 is built such that the comparison supply voltage 1.1 is lower than the reference voltage 27 as long as the supply voltage 1 is lower than the startup threshold. In this case, the output of the comparator is high. As soon as the supply voltage 1 exceeds the startup threshold, that is as soon as the comparison supply voltage 1.1 exceeds the reference voltage 27, the output of the comparator goes low. On the one hand, this causes the counter 26 to begin counting and on the other hand, the voltage divider 28 is modified to generate a lower comparison supply voltage 1.1 that is now compared with the reference voltage 27 to determine whether the supply voltage falls below the shutdown threshold.

The output of the counter 26, that is the reset signal 2 is high as long as the counter 26 counts and therefore, the functional unit 21 is disabled. When the delay has lapsed, that is when the counter 26 has reached a predefined value, the output of the counter goes low, which means that the functional unit 21 and therewith the whole hearing aid 20 is enabled.

Figure 3:
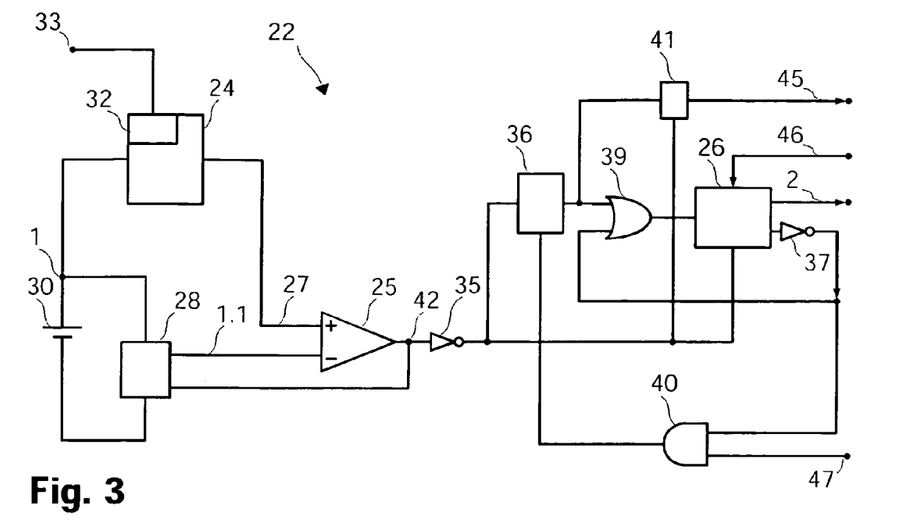
FIG. 3 a more detailed block diagram of the controlling device of FIG. 2.

FIG. 3 shows a more detailed block diagram of the controlling device 22 of FIG. 2. The controlling device 22 is supplied with power by a battery 30 which is the power supply of the whole hearing aid. The reference generator 24 receives the supply voltage 1 from the battery 30 and produces from it a reference voltage 27 that is fed to the positive input of the comparator 25. The reference generator 24 includes a voltage level selection unit 32, that enables a user to select the level of the generated reference voltage 27 for example by applying a binary code 33 to the voltage level selection unit 32, where the binary code 33 represents one of a plurality of predefined reference voltage levels.

The supply voltage 1 is also fed to the input of the modifiable voltage divider 28 whose output is the comparison supply voltage 1.1. The modifiable voltage divider is controlled by the comparator output 42 and is described in more detail in connection with the description of FIG. 4 below.

The comparator output 42 is inverted by an inverter 35 and fed to the input of a clock generator 36 that provides via the OR-gate 39 a clock signal for the counter 26 which in turn provides the reset signal 2 at its output. The reset signal 2 typically is high as long as the comparison supply voltage 1.1 is lower than the reference voltage 27. At the moment when the comparison supply voltage 1.1 increases the reference voltage 27, the clock generator 26 starts to generate the clock signal and therefore the counter 26 starts to count. When the counter 26 reaches a predefined value (that is after a predefined delay), the reset signal 2 goes low thereby enabling the functional unit 21. At the same time, the clock generator 36 is disabled via the AND-gate 40 in order to save current consumption of the controlling device 22. The controlling device is for example built such that the delay is programmable too.

The output of the counter 26 is inverted by inverter 37 and fed back to the second input of the OR-gate 39, which disables the counter 26 when the reset signal is low. This function is necessary when the low power mode is required. In this case a low level on the low power mode input 47 enables the clock generator 36 to provide a low power mode clock signal on low power mode clock output 45 and the high level fed back to the second input of the OR-gate 39 prevents the counter 26 to start to count again and provides a reset signal to the functional unit 21. It is to note that the inverter 37 could for example also be integtrated into the counter 26 thereby providing a non-inverted and an inverted output.

The hearing aid may run in (at least) two different power modes. In the normal power mode, the clock signal for the digital parts of the hearing aid is generated by a separate clock generator (not shown) with a clock frequency that is higher than the frequency of the clock signal generated by the clock generator 36. In the low power mode (which is some kind of sleep mode), most parts of the hearing aid including the separate clock generator are switched off to save current consumption. The low power mode is controlled by the low power mode input 47 which is generated by the functional unit 21 or any other part of the hearing aid. The low power mode input 47 is fed to the second input of the AND-gate 40. When the hearing aid runs in its normal power mode, the reset signal 2 is low and the low power mode input 47 is high and therefore the clock generator 36 is disabled.

The hearing aid runs in the low power mode when the low power mode input 47 is low. In this case the reset signal 2 stays low and enables the functional unit 21 to continue to work but with a lower clock signal. Therefore, the clock generator 36 is enabled and produces its clock signal. In low power mode, the clock signal from the clock generator 36 having a low clock frequency is fed to a latch 41, which acts as a frequency divider providing a clock signal for the hearing aid in the low power mode. The latch is for example implemented as a T flip flop which divides the frequency of the clock generator's 36 clock by two.

The counter 26 further includes a manual reset input 46 for manually resetting the counter 26.

Figure 4:
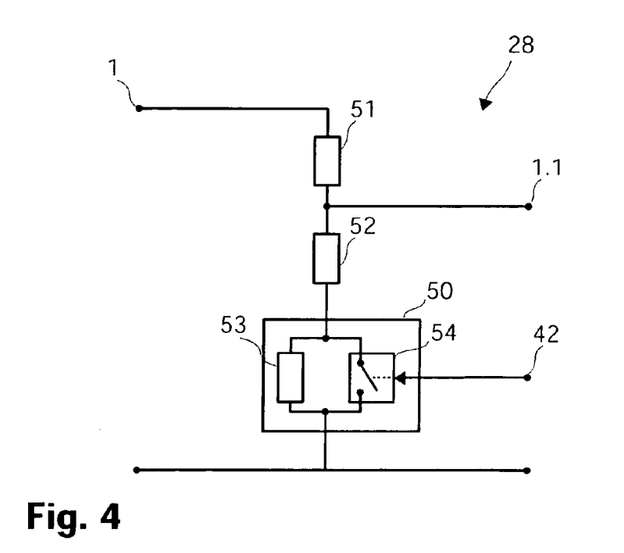
FIG. 4 a block diagram of the voltage divider of FIG. 3.

FIG. 4 shows the modifiable voltage divider 28 in more detail. Additionally to the two resistors R1 51 and R2 52, the voltage divider 28 includes a hysteresis control 50 that is controlled by the comparator output 42. The hysteresis control 50 comprises a parallel circuit of a further resistor R3 53 and a switch S1 54. If the comparator output 42 is high, the switch S1 54 is closed such that resistor R3 53 is bypassed by a short circuit. In this case, the output voltage $U_{closed}$ (comparison supply voltage 1.1) of the voltage divider 28 for a given input voltage $U_{in}$ (the supply voltage 1) is:

$$U_{closed}=U_{in}*(R2)/(R1+R2).\tag{I}$$

That is, as long as the supply voltage 1 is lower than the startup threshold, the reference voltage 27 is compared with $U_{closed}$. This means that it is detected whether the supply voltage exceeds the startup threshold.

At the moment when the supply voltage exceeds the startup threshold, the comparator output 42 goes low and the switch S1 54 is opened such that resistor R3 53 is not shorted any more. In this case, the output voltage $U_{open}$ (comparison supply voltage 1.1) of the voltage divider 28 for a given input voltage $U_{in}$ (the supply voltage 1) is:

$$U_{open} = U_{in} * (R2+R3)/(R1+R2+R3) \quad (II)$$

That is, as soon as the supply voltage 1 has exceeded the startup threshold, the reference voltage 27 is compared with $U_{open}$, which is higher than $U_{closed}$. This means that it is detected whether the supply voltage 1 falls below the shutdown threshold.

At the moment when the supply voltage falls below the shutdown threshold, the comparator output 42 goes high and therefore the switch S1 54 is closed which means that it is detected whether the supply voltage again exceeds the startup threshold.

In an examplary implementation of the controlling device 22, the values of the elements are as follows:

| | |
|---|---|
| supply voltage | 0.7 V-2 V |
| startup threshold | 0.85 V |
| shutdown threshold | 0.83 V |
| hysteresis voltage ($U_{open}$-$U_{closed}$) | 20 mV |
| delay | 12.5 ms |
| R1 | 1184.5 kOhm |
| R2 | 990.6 kOhm |

The value of resistor R3 depends on the specific value of the supply voltage and is chosen such that the hysteresis voltage is 20 mV.

Generally it is to note that the digital circuit may also be implemented such that the active/inactive level of one or more of the digital signals is high instead of low or low instead of high. It is also possible to implement the circuit such that an active signal is represented by a (positive or negative) pulse instead of the signal level.

In summary, it is to be noted that the invention allows a safe startup and shutdown process of an electrical device by reducing undesired effects in connection with transients, brownout or other oscillations of the input voltage. This is done by delaying the startup of an electrical device until the supply voltage has stabilised above a certain level. This is particularly true in cases where the device is switched on or off, when a battery is inserted or removed or when the battery is dying.

The invention claimed is:

1. Method for controlling an operation of an electrical device, comprising:
   supplying a supply voltage having a supply voltage level from a supply voltage source;
   detecting the supply voltage level;
   initiating a transition of at least a part of the electrical device from a disabled state to an enabled state after the supply voltage level is detected in the detecting step to rise above a startup reference voltage level and the detected supply voltage level is detected to be above a shutdown reference voltage level that is lower than the startup reference voltage level after a given delay period of time; and
   initiating a transition of the at least a part of the electrical device from the enabled state back to the disabled state when the supply voltage level falls below the shutdown reference voltage level after the given delay period of time has terminated.

2. Method according to claim 1, wherein it is determined whether the supply voltage level falls below the shutdown reference voltage level by:
   generating a reference voltage;
   generating a startup comparison voltage proportional to the supply voltage; and
   comparing the startup comparison voltage with the reference voltage.

3. Method according to claim 2, wherein it is determined whether the supply voltage level falls below the shutdown reference voltage level by:
   generating a shutdown comparison voltage level proportional to the supply voltage level, where the shutdown comparison voltage level is higher than the startup comparison voltage level; and
   comparing the shutdown comparison voltage level with the reference voltage level.

4. Method according to claim 3, wherein the shutdown comparison voltage level and the startup comparison voltage level are generated by a single, variable, ohmic voltage divider.

5. Controlling device for controlling an operation of an electrical device, the electrical device including a voltage source that provides a supply voltage having a supply voltage level,
   wherein the controlling device includes:
   means for detecting the supply voltage level;
   means for initiating a transition of the electrical device from a disabled state to an enabled state after the supply voltage level is detected by the means for detecting the supply voltage level to rise above a startup reference voltage level and to have remained above a shutdown reference voltage level that is lower than the startup reference voltage level for a given delay period of time; and
   means for initiating a transition from the enabled state to the disabled state when the supply voltage level falls below the shutdown reference voltage level after the given delay period of time has terminated.

6. Controlling device according to claim 5, further including a comparator for determining whether the supply voltage level has risen above the startup reference voltage level.

7. Controlling device according to claim 6, further including:
   a reference voltage generator for generating a reference voltage with a reference voltage level, and
   a voltage divider for generating a comparison voltage level proportional to the supply voltage level, the reference voltage level being input to a first input of the comparator, the comparison voltage level being input to a second input of the comparator and the voltage divider being built such that a startup comparison voltage level or a shutdown comparison voltage level is respectively generated in dependency of an output of the comparator.

8. Controlling device according to claim 7, wherein the reference voltage generator includes selection means for selecting the level of the reference voltage where the selection means are particularly built for selecting said level of the reference voltage by soft programming.

9. Controlling device according to claim 5, further including a delay generator for generating the given delay period of time, the delay generator including a clock generator and a counter.

10. Controlling device according to claim 5, further including a low power mode input, the controlling device being built such that a low power mode clock frequency is generated for driving said electrical device when said low power mode input is activated, where the low power mode clock frequency is lower than a normal clock frequency of the electrical device.

11. An electrical listening device including a battery voltage source and a controlling device according to claim 5.

12. An electrical listening device including a battery voltage source and a controlling device according to claim 6.

13. An electrical listening device including a battery voltage source and a controlling device according to claim 7.

14. An electrical listening device including a battery voltage source and a controlling device according to claim 8.

15. An electrical listening device including a battery voltage source and a controlling device according to claim 9.

16. An electrical listening device including a battery voltage source and a controlling device according to claim 10.

* * * * *